United States Patent
Körber et al.

(10) Patent No.: US 6,741,479 B2
(45) Date of Patent: May 25, 2004

(54) ACTUATOR ELEMENT FOR LEVERING IN AND OUT PRINTED CIRCUIT MODULES WITH LOCKING SLIDE, FRONT ELEMENT FOR A PRINTED CIRCUIT MODULE WITH ACTUATOR ELEMENT, AND SUBRACK THAT RECEIVES PRINTED CIRCUIT MODULES

(75) Inventors: Werner Körber, Betzenstein (DE); Siegfried Kurrer, Nürnberg (DE); Kurt-Michael Schaffer, Eckental (DE)

(73) Assignee: RITTAL RES Electronic Systems GmbH & Co. KG, Eckental (DE)

( * ) Notice: Subject to any disclaimer, the term of this patent is extended or adjusted under 35 U.S.C. 154(b) by 0 days.

(21) Appl. No.: 10/168,908

(22) PCT Filed: Dec. 11, 2000

(86) PCT No.: PCT/DE00/04400
§ 371 (c)(1),
(2), (4) Date: Nov. 4, 2002

(87) PCT Pub. No.: WO01/49091
PCT Pub. Date: Jul. 5, 2001

(65) Prior Publication Data
US 2003/0194892 A1 Oct. 16, 2003

(30) Foreign Application Priority Data
Dec. 23, 1999 (DE) .................................. 299 22 725 U

(51) Int. Cl.⁷ .............................. H05K 7/14; H05K 7/18
(52) U.S. Cl. .................. 361/801; 361/726; 361/747; 361/732; 200/51.09; 439/261; 439/266
(58) Field of Search ............................ 361/801, 759, 361/740, 726, 747, 754, 732; 200/51.09; 439/261, 266, 372

(56) References Cited

U.S. PATENT DOCUMENTS

| 4,917,618 | A |   | 4/1990  | Behrens et al. |         |
|-----------|---|---|---------|----------------|---------|
| 5,571,025 | A | * | 11/1996 | Arai et al.    | 439/160 |
| 5,629,836 | A | * | 5/1997  | Wright         | 361/755 |
| 5,828,546 | A | * | 10/1998 | Tirrell et al. | 361/685 |
| 5,940,276 | A |   | 8/1999  | Kurrer et al.  |         |
| 5,959,843 | A |   | 9/1999  | Kurrer et al.  |         |
| 6,094,353 | A |   | 7/2000  | Koerber et al. |         |
| 6,128,198 | A |   | 10/2000 | Kurrer et al.  |         |
| 6,220,879 | B1| * | 4/2001  | Ulrich         | 439/160 |

FOREIGN PATENT DOCUMENTS

| DE | 298 23 122 U 1 | 2/1999  |
| EP | 0 330 957 A1   | 9/1989  |
| EP | 0 832 547 B1   | 4/1998  |
| WO | WO 96/42187    | 12/1996 |
| WO | WO 98/34449    | 8/1998  |

* cited by examiner

Primary Examiner—David Martin
Assistant Examiner—Hung Bui
(74) Attorney, Agent, or Firm—Pauley Petersen & Erickson

(57) ABSTRACT

An actuator element for levering in and out printed circuit modules. The actuator element has an end piece that is adapted to be linked with a printed circuit module an actuator lever. The actuator lever is rotatably mounted on the end piece and has at least one handle part and one locking slide that can be slid between at least two switch positions. The locking slide, in a first switch position, retain the actuator lever in a first position that corresponds to a fastened state of the printed circuit module, and releases the actuator lever in a second switch position.

31 Claims, 2 Drawing Sheets

ACTUATOR ELEMENT FOR LEVERING IN AND OUT PRINTED CIRCUIT MODULES WITH LOCKING SLIDE, FRONT ELEMENT FOR A PRINTED CIRCUIT MODULE WITH ACTUATOR ELEMENT, AND SUBRACK THAT RECEIVES PRINTED CIRCUIT MODULES

BACKGROUND OF THE INVENTION

1. Field of the Invention

This invention relates to an operating element, by which printed circuit board modules with electronic circuits can be levered into a support system, or removed therefrom, with little application of force.

2. Description of Related Art

Similar operating elements have been employed and are known in various embodiments. A widely used embodiment of such an operating element is taught by European Patent EP 0 330 957 B1. It is called a plug-in and removal aid and is part of a front system for plug-in modules which can be pushed into a module support. The plug-in and removal aid has a lever, which is rotatably seated on an end piece. An operator can operate the plug-in and removal aid with the lever and can effect the levering in or out of the plug-in modules by appropriate pivoting. To achieve these movements, the lever has a groove, the outer edges of which are designed as protrusions. During the levering in or levering out movement, the protrusions are supported on corresponding edges of the module support, in particular on transverse connecting rails of the module support.

In particular uses, printed circuit board modules which are plugged into a module support can be subjected to special stresses caused by unfavorable environmental conditions. For example, it is possible to apply shaking moments to a component support from the outside. In such a case it is possible for printed circuit board modules which are plugged into the module support to loosen and for the electrical contacts at their plug connectors to be at least partially interrupted. To avoid these problems it is known to design the lever pull handles attached to a front system of a printed circuit board module so they can be locked. A front system for printed circuit boards having such lockable lever pull handles is described in PCT International Application having Publication Number WO 98/34449. A locking slide is seated in the interior of the lever pull handle there, which locks and secures the lever pull handle, and thus the front system and the printed circuit board module, in a position in which they are pushed into the module support. Release, and therefore the opening of a possibility of taking the printed circuit board module out of the module support, such as levering it out, is only possible after operating the integrated locking slide. During this the problem occurs that for unlocking the locking slide it is necessary to exert a pressure force from above on the lever pull handle. This is economically disadvantageous and can limit a rapid unhampered operation of the lever pull handle.

A similar arrangement is described by German Utility Model DE 298 23 122 U1. An additional, spring-operated bolt is integrated into the levering in and levering out handle. The bolt locks the levering in and levering out handle in a rear end position of the plug-in module, which corresponds to a state where it is inserted into the module support. In this arrangement the bolt is also used for operating, or releasing, a switching element integrated into the levering in and levering out handle. This switching element is used for an active-passive switching of the plug-in module. In this case the plug-in module is switched to passive with the operation of the bolt. The problem, that the operation of the bolt requires a pressing force to be exerted from above, also occurs with this arrangement. This is ergonomically disadvantageous and can limit a rapid unhampered operation of the lever pull handle.

SUMMARY OF THE INVENTION

One object of this invention is to provide an operating element for printed circuit board modules, in particular one into which a spring-operated bolt is integrated, so that it is easier to operate.

This object is attained with the operating element described in this specification and the claims. One embodiment of this invention relates to a front system for a printed circuit board module having at least one operating in accordance with this invention, and other embodiments relate to a printed circuit board module with an appropriate front system and to a module support with an appropriate front system.

The operating element in accordance with this invention has an end piece, which is prepared for being connected to a printed circuit board module, and an operating lever. The operating lever is rotatably seated on the end piece and has at least a handle element and a locking slide, which can be displaced between at least two switching positions. In this case, in a first switching position the locking slide maintains the operating lever in a first position, which corresponds to the levered in state of the printed circuit board module, and releases the operating lever in a second switching position.

Such an embodiment has one advantage that the operation of a locking slide, in particular one accessible on the top of the handle element, is considerably simplified.

BRIEF DESCRIPTION OF THE DRAWINGS

This invention is explained in greater detail in view of the drawing figures, wherein.

DESCRIPTION OF PREFERRED EMBODIMENTS

Figure 1:
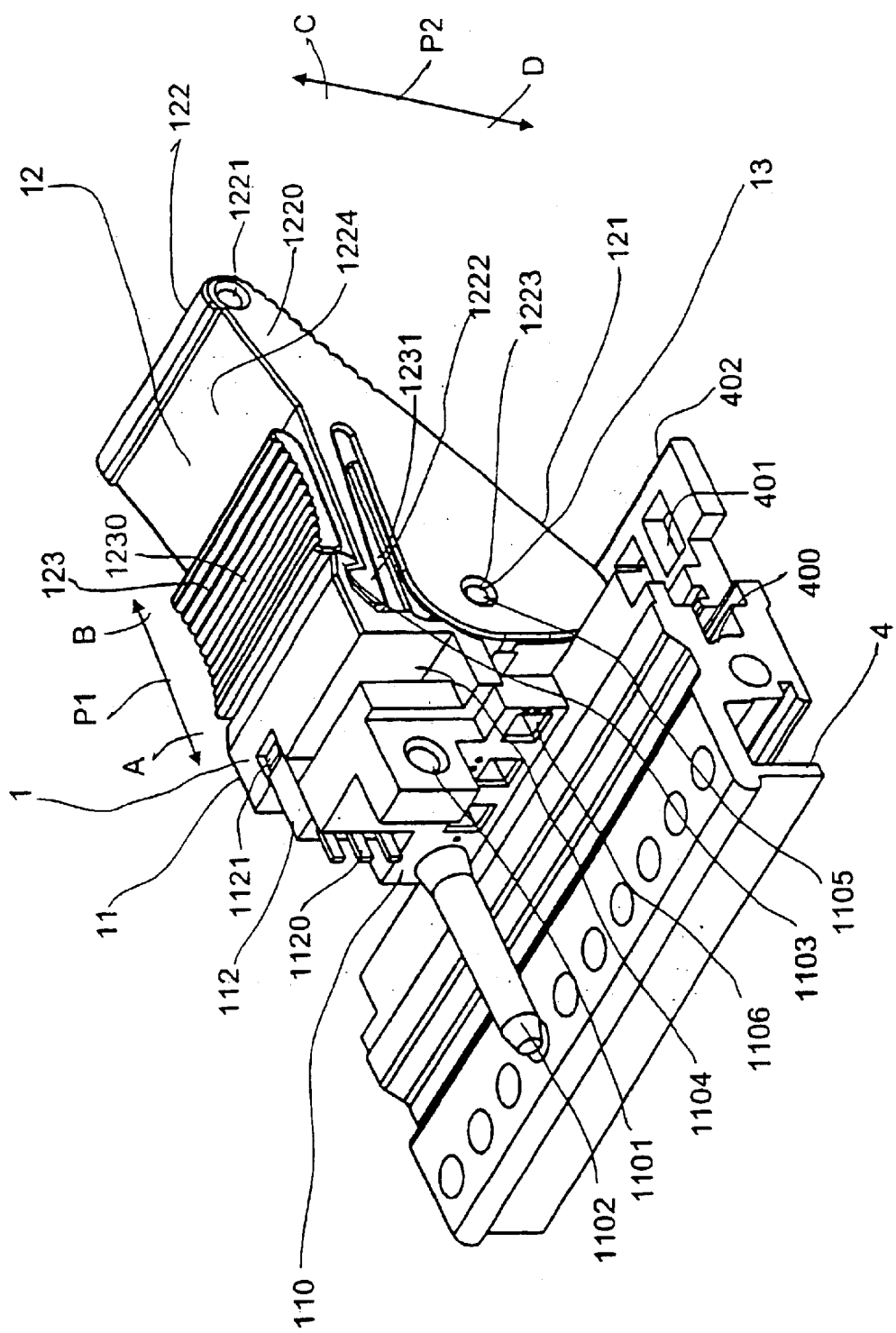
FIG. 1 is a perspective lateral view of one embodiment of an operating element in accordance with this invention.
Figure 2:
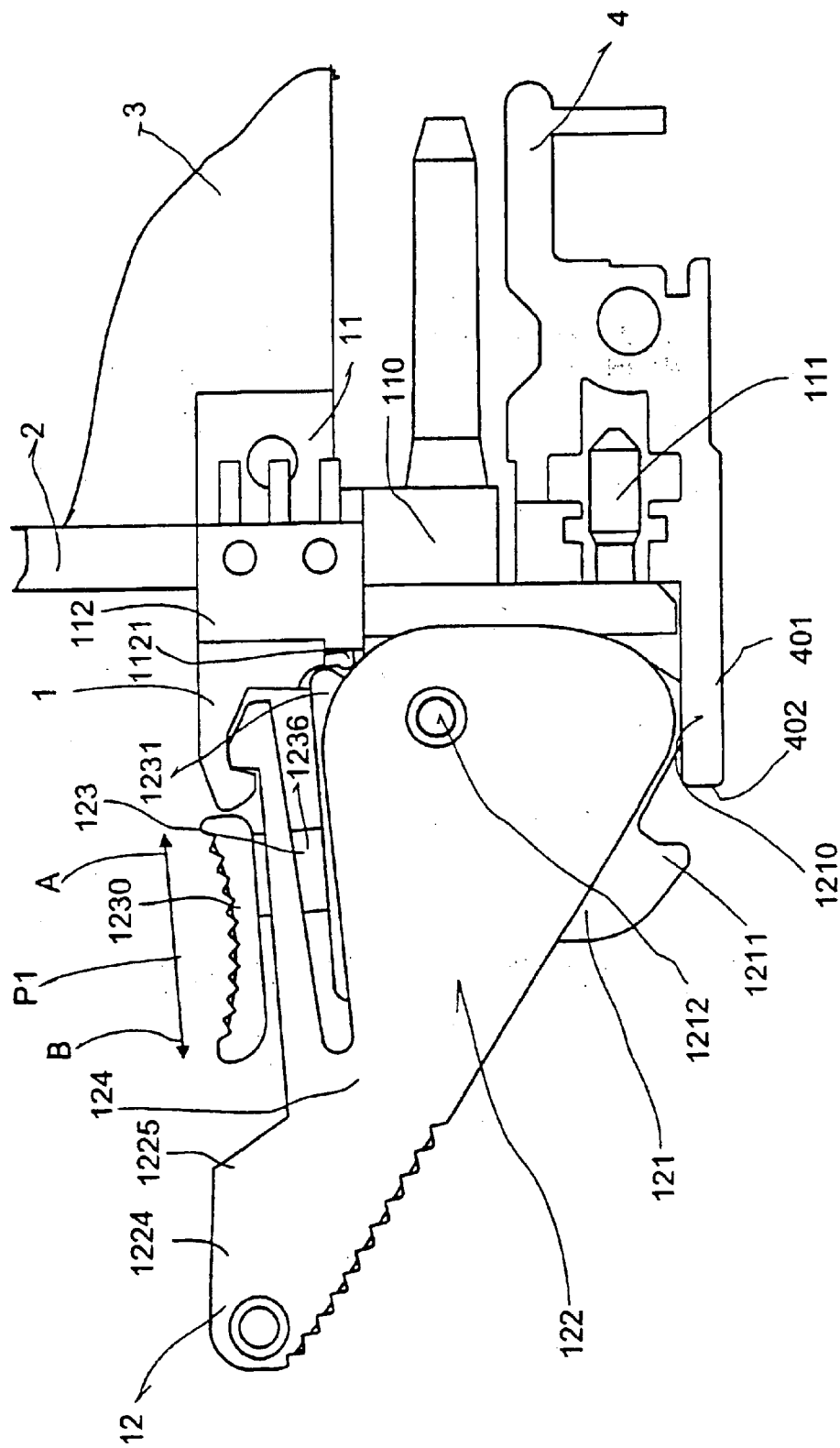
FIG. 2 is a lateral plan view of a front system for a printed circuit board module, having an operating element in accordance with this invention.

FIGS. 1 and 2 represent a lateral view of one embodiment of an operating element 1 in accordance with this invention, used for levering in and/or levering out a printed circuit board module 3. As basic elements, the operating element 1 has an end piece 11, which is prepared to be connected with a printed circuit board module, and an operating lever 12, which is rotatably seated on the end piece 11. In accordance with this invention, the operating lever 12 has at least a handle element 122 and a locking slide 123 which can be displaced between at least two switching positions A and B. In a first switching position A, the operating lever 12 is maintained in a first position C, which corresponds to the levered in state of the printed circuit board module 3. This position is represented in FIGS. 1 and 2. But in a second switching position B, the operating lever 12 is released by the locking slide 123. The operating lever 12 can then pivot, or be pivoted, into a second position D. Such a tilted position can correspond to the state when the printed circuit board module 3 is levered out of the module support. In FIG. 1 the positions C and D of the operating lever 12 are represented by an arrow P2, and the switching position A and B by an arrow P1.

It is advantageous if the operating lever 12 also has an element 121 for levering in and/or levering out, which is at least partially of a wear-resistant material. This is connected with the handle element 122 and advantageously has a levering in protrusion 1210, as well as a levering out protrusion 1211. For causing a levering in, or levering out of the printed circuit board module 3, the levering in and/or levering out element 121 is supported on the module support. In the examples represented in FIGS. 1 and 2, a lower transverse connecting rail 4 is shown by way of example as a portion of a module support. It has a perforated rail 401 with a series of engagement holes. When levering in, the levering protrusion 1210 is supported in an engagement hole of the perforated rail 401, as represented in FIG. 2, while when levering out, the levering out protrusion 1211 is supported on the front face 402 of the perforated rail 401.

The end piece 11 of the operating element 1 which, by way of example, is shown in a perspective rear view in FIG. 1 and in a lateral view in FIG. 2, has a support body 110 in its core. The support body 110 has a bore 1101, which can be used for fastening to a printed circuit board module 3, for example with a screw. The end piece 11 has a contact pin 1102 which, when a printed circuit board module having an appropriate operating element is inserted, provides a ground contact between the elements. A holding screw 111, which can engage a transverse groove 400 of the transverse connecting rail 4, can be provided in the support body 110 for holding a unit inserted into a module support, for example a printed circuit board module with an attached front system having a front plate and preferably two operating elements 1 at the ends. The support body 110 has a bore 1105. A rotary shaft 13 can be inserted into the bore 1105, by which the operating lever 12 can be rotatably maintained on the support body 110. The rotary shaft 13 can simultaneously be located in a bore 1212 of an additional levering in and levering out element 121. In this case all parts of the operating lever 12 are connected via the rotary shaft 13 with the end piece 11. Furthermore, a holding groove 1104 for pushing in the lower end of a front plate 2, represented in part, is advantageously provided. Finally, on its side facing the operating lever 12, the support body 110 has a detent protrusion 1103. A corresponding, preferably resilient detent disk 1222 of the operating lever 12 can engage the detent protrusion 1103 when the lever is in the locked-in position.

A switching element 112, in particular a microswitch, can be integrated into the end piece 11 of the operating element 1. The functioning of such a switching element 112, for example is described by European Patent EP 0 832 547. The locking slide 123 and the switching element 122 are matched to each other so that in the first switching position A the locking slide 123 also activates the switching element 112.

In accordance with this invention, the operating lever 12 of the operating element 1 shown in the example of FIG. 1 has a handle element 122 and a levering in and/or levering out element 121. In this case the handle element 122 has a bore 1223, the levering in and/or levering out element 121 has a bore 1212, and the end piece 11 has a bore 1105. It is possible to conduct a rotary shaft 13 through all bores in such a way that the operating lever 12 is rotatably seated on the end piece 11. With a rotation it is possible to cause the levering in of a printed circuit board module 3, connected with the end piece, into a module support, or a levering out of the module support.

The handle element 122 has a handle head 1220, which permits an operator to grasp it manually. With the additional transverse bore 1221 at the front end of the handle head 1220, adjacently located handle elements 122 of several operating elements which are attached to various printed circuit board modules can be mechanically connected so that their synchronous movement is possible. FIG. 1 shows the handle element 122 in a position corresponding to a state of the printed circuit board module 3 when it is levered into a module support. The handle element 122 is also locked together with the end piece 11 in this position with the aid of a detent, because a resilient detent disk 1222 of the handle element 122 engages a detent protrusion 1103 of the end piece 11 from behind. The operating lever 12 is moved back into the position of rest shown in FIG. 1 by an integrated restoring spring 14, not shown in FIG. 1, when no downward directed force is exerted on the handle element 122.

The locking slide 123 of the operating element 1 has an operating slide 1230, on its top 1224, which can be displaced on the handle element 122. Such an arrangement offers good dependability of the grip when manipulating the operating lever. Also, an operating slide 1230 located on the top 1224 of the handle head 122 can be manipulated very easily, for example its different switching positions can be rapidly and dependably set by an operator.

Ergonomics can be further improved if the handle element 122 in accordance with the embodiment shown in FIG. 2 has a depression 1225 on an exterior, in particular on the top 1224, in which the operating slide 1230 is located in a quasi sunk position and can be displaced. It is advantageous if the operating slide 1230 is as flat as possible, has a depression on the exterior, which can be provided with ribbing.

For activating an integrated switching element 112, the locking slide 123 has an additional switching slide 1231 integrated into the handle element 122. FIG. 2 shows the state in which the switching slide 1231 operates the switching bow 1121 of the switching element 112. The operating slide 1230 and the switching slide 1231 of the locking slide 123 are arranged approximately perpendicularly in relation to the displacement direction A–B and are connected with each other via a connecting column 1236. Finally, the operating lever 12 has integrated a spring element 124, which exert a thrust on the locking slide 123 in the direction of the first switching position A. In the embodiment of FIG. 2 this results in a bias force exerted on the locking slide 123, in the direction toward the support body 110 of the end piece 11, and in particular toward the switching bow 1121 of the switching element 112.

What is claimed is:

1. In an operating element (1) for levering a printed circuit board module (3) in and out of a support system, the improvement comprising: an end piece (11) prepared for a connection with a printed circuit board module (3), an operating lever (12) rotatably seated on the end piece (11) and having at least a handle element (122), a locking slide (123) displaceable between at least two switching positions (A, B) and in a first switching position (A) maintains the operating lever (12) in a first position (C) which corresponds to a levered in state of the printed circuit board module (3) and in a second switching position (B) releases the operating lever (12), the locking slide (123) having an operating slide (1230) which is displaceable on the handle element (122), the operating slide (1230) displaceable on a top (1224) of the handle element (122), a switching element (122) integrated into the end piece (11) and, for activating the switching element (122) in the first switching position (A) the locking slide (123) having a switching slide (1231) integrated into the handle element (122), and the operating slide (1230) and the switching slide (1231) of the locking slide (123) arranged perpendicular relative to a displacement direction (A–B) and connected with each other by a connecting column (1236).

2. In the operating element (1) in accordance with claim 1, wherein on an exterior the handle element (122) has a depression (1225) in which the operating slide (1230) is displaceable.

3. In the operating element (1) in accordance with claim 2, wherein the operating slide (1230) is flat.

4. In the operating element (1) in accordance with claim 3, wherein the operating slide (1230) has a depression on the exterior.

5. In the operating element (1) in accordance with claim 4, wherein the operating slide (1230) has ribbing on the exterior.

6. In the operating element (1) in accordance with claim 5, wherein a switching element (112) is integrated into the end piece (11), and in the first switching position (A) the locking slide (123) activates the switching element (112).

7. In the operating element (1) in accordance with claim 6, wherein for activating the switching element (112), the locking slide (123) has a switching slide (1231) integrated into the handle element (122).

8. In the operating element (1) in accordance with claim 7, wherein the operating lever (12) has a spring element (124) which exerts a force on the locking slide (123) which is directed toward the first switching position (A).

9. In the operating element (1)in accordance with claim 8, wherein the handle element (122) has a levering in and levering out element (121) which is at least partially of a wear-resistant material.

10. In the operating element (1) in accordance with claim 9, wherein the levering in and levering out element (121) has at least one protrusion (1210, 1211) of a wear-resistant material.

11. In the operating element (1) in accordance with claim 9, wherein the end piece (11), the levering in and levering out element (121) and the handle element (122) of the operating lever (12) have bores (1105,1212,1223) and are connected with each other via an inserted rotary shaft (13).

12. In the operating element (1) in accordance with claim 10, wherein the handle element (122) of the operating lever (12) is of a material of plastic.

13. In the operating element (1) in accordance with claim 12, wherein the end piece (11) and the handle element (122) of the operating lever (12) have bores (1105,1223) and are connected with each other via an inserted rotary shaft (13).

14. In the operating element (1) in accordance with claim 10, wherein the end piece (11), the levering in and levering out element (121) and the handle element (122) of the operating lever (12) have bores (1105,1212,1223) and are connected with each other via an inserted rotary shaft (13).

15. In the operating element (1) in accordance with claim 14, wherein a front system for a printed circuit board module (3), having a front plate (2) and the operating element (1) is attached to an end of the front plate.(2).

16. In the operating element (1) in accordance with claim 15, wherein the printed circuit board module has the front system.

17. In the operating element (1) in accordance with claim 15, further comprising a module support (4) within which the printed circuit board module (3) having the front system can be levered in and levered out.

18. In the operating element (1) in accordance with claim 1, wherein the operating slide (1230) is flat.

19. In the operating element (1) in accordance with claim 18, wherein a switching element (122) is integrated into the end piece (11) and, for activating the switching element (122) in the first switching position (A) the locking slide (123) has a switching slide (1231) integrated into the handle element (122), and the operating slide (1230) and the switching slide (1231) of the locking slide (123) are arranged perpendicular relative to the displacement direction (A–B) and are connected with each other by a connecting column (1236).

20. In the operating element (1) in accordance with claim 1, wherein the operating slide (1230) has a depression on the exterior.

21. In the operating element (1) in accordance with claim 1, wherein the operating slide (1230) has ribbing on an exterior.

22. In the operating element (1) in accordance with claim 1, wherein a switching element (112) is integrated into the end piece (11), and in the first switching position (A) the locking slide (123) activates the switching element (112).

23. In the operating element (1) in accordance with claim 22, wherein for activating the switching element (112), the locking slide (123) has a switching slide (1231) integrated into the handle element (122).

24. In the operating element (1) in accordance with claim 1, wherein the operating lever (12) has a spring element (124) which exerts a force on the locking slide (123) which is directed toward the first switching position (A).

25. In the operating element (1) in accordance with claim 1, wherein the handle element (122) has a levering in and levering out element (121) which is at least partially of a wear-resistant material.

26. In the operating element (1) in accordance with claim 25, wherein the levering in and levering out element (121) has at least one protrusion (1210, 1211) of a wear-resistant material.

27. In the operating element (1) in accordance with claim 1, wherein the handle element (122) of the operating lever (12) is of a material of plastic.

28. In the operating element (1) in accordance with claim 1, wherein the end piece (11) and the handle element. (122) of the operating lever(12) have bores (1105,1223) and are connected with each other via an inserted rotary shaft (13).

29. In the operating element (1) in accordance with claim 1, wherein a front system for a printed circuit board module (3), having a front plate (2) and the operating element (1) is attached to an end of the front plant (2).

30. In the operating element (1) in accordance with claim 29, wherein the printed circuit board module has the front system.

31. In the operating element (1) in accordance with claim 29, further comprising a module support (4) within which the printed circuit board module (3) having the front system can be levered in and levered out.

* * * * *